US010714396B2

(12) United States Patent
Anderson et al.

(10) Patent No.: US 10,714,396 B2
(45) Date of Patent: Jul. 14, 2020

(54) VARIABLE GATE LENGTHS FOR VERTICAL TRANSISTORS

(71) Applicant: International Business Machines Corporation, Armonk, NY (US)

(72) Inventors: Brent A. Anderson, Jericho, VT (US); Edward J. Nowak, Shelburne, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/455,801

(22) Filed: Jun. 28, 2019

(65) Prior Publication Data

US 2019/0318965 A1 Oct. 17, 2019

Related U.S. Application Data

(63) Continuation of application No. 15/995,632, filed on Jun. 1, 2018, now Pat. No. 10,395,992, which is a (Continued)

(51) Int. Cl.
*H01L 21/8234* (2006.01)
*H01L 21/311* (2006.01)
(Continued)

(52) U.S. Cl.
CPC ........ *H01L 21/823487* (2013.01); *H01L 21/31116* (2013.01); *H01L 21/32136* (2013.01);
(Continued)

(58) Field of Classification Search
CPC ........... H01L 29/7799; H01L 29/7827; H01L 29/66666; H01L 29/7371; H01L 21/823487; H01L 29/732
See application file for complete search history.

(56) References Cited

U.S. PATENT DOCUMENTS 4,791,462 A 12/1988 Blanchard et al.
5,432,114 A * 7/1995 O .................... H01L 21/823857
257/E21.639
(Continued)

FOREIGN PATENT DOCUMENTS

CN 101449367 A 6/2009
GB 2559935 B 8/2019
(Continued)

OTHER PUBLICATIONS

"Patents Act 1977: Examination Report under Section18(3)", Intellectual Property Office, Your Reference PCT/IB2016/057484, Application No. GB1809710.5, dated Aug. 10, 2018, 3 pages.
(Continued)

*Primary Examiner* — Bilkis Jahan
*Assistant Examiner* — Victor V Barzykin
(74) *Attorney, Agent, or Firm* — Christopher K. McLane; Alexander G. Jochym

(57) ABSTRACT

The method includes prior to depositing a gate on a first vertical FET on a semiconductor substrate, depositing a first layer on the first vertical FET on the semiconductor substrate. The method further includes prior to depositing a gate on a second vertical FET on the semiconductor substrate, depositing a second layer on the second vertical FET on the semiconductor substrate. The method further includes etching the first layer on the first vertical FET to a lower height than the second layer on the second vertical FET. The method further includes depositing a gate material on both the first vertical FET and the second vertical FET. The method further includes etching the gate material on both the first vertical FET and the second vertical FET to a co-planar height.

7 Claims, 5 Drawing Sheets

Related U.S. Application Data continuation of application No. 14/970,624, filed on Dec. 16, 2015, now Pat. No. 10,026,653.

(51) Int. Cl.
| | |
|---|---|
| *H01L 21/3213* | (2006.01) |
| *H01L 29/66* | (2006.01) |
| *H01L 27/088* | (2006.01) |
| *H01L 29/423* | (2006.01) |
| *H01L 29/49* | (2006.01) |
| *H01L 29/78* | (2006.01) |

(52) U.S. Cl.
CPC .... *H01L 21/823456* (2013.01); *H01L 27/088* (2013.01); *H01L 29/42364* (2013.01); *H01L 29/4966* (2013.01); *H01L 29/66666* (2013.01); *H01L 29/7827* (2013.01); *H01L 21/823462* (2013.01)

(56) References Cited

U.S. PATENT DOCUMENTS

| | | | |
|---|---|---|---|
| 5,627,393 A | 5/1997 | Hsu | |
| 6,156,611 A | 12/2000 | Lan et al. | |
| 6,632,712 B1* | 10/2003 | Ang | H01L 21/823885 257/328 |
| 6,949,421 B1 | 9/2005 | Padmanabhan et al. | |
| 7,247,905 B2* | 7/2007 | Cheng | H01L 27/10867 257/301 |
| 7,294,879 B2* | 11/2007 | Chen | H01L 27/10864 257/301 |
| 7,372,091 B2 | 5/2008 | Leslie | |
| 7,683,428 B2 | 3/2010 | Chidambarrao et al. | |
| 8,653,584 B2 | 2/2014 | Renn | |
| 10,026,653 B2 | 7/2018 | Anderson | |
| 10,395,992 B2 | 8/2019 | Anderson | |
| 2005/0190590 A1* | 9/2005 | Chen | H01L 27/10841 365/149 |
| 2008/0121948 A1 | 5/2008 | Kim et al. | |
| 2008/0157225 A1 | 7/2008 | Datta et al. | |
| 2010/0140688 A1* | 6/2010 | Fujimoto | H01L 21/823437 257/329 |
| 2011/0042748 A1 | 2/2011 | Anderson et al. | |
| 2011/0233512 A1 | 9/2011 | Yang et al. | |
| 2011/0260259 A1* | 10/2011 | Masuoka | H01L 21/823821 257/369 |
| 2012/0025874 A1* | 2/2012 | Saikaku | H01L 29/66727 327/109 |
| 2014/0166981 A1* | 6/2014 | Doyle | H01L 29/66666 257/24 |
| 2015/0187867 A1 | 7/2015 | Basker et al. | |
| 2015/0206970 A1 | 7/2015 | Lin et al. | |
| 2016/0172488 A1* | 6/2016 | Oh | H01L 29/7827 257/330 |
| 2017/0178970 A1 | 6/2017 | Anderson et al. | |
| 2018/0277444 A1 | 9/2018 | Anderson | |

FOREIGN PATENT DOCUMENTS

| | | |
|---|---|---|
| JP | 2018537860 A | 12/2018 |
| WO | 2015047281 A1 | 4/2015 |
| WO | 2017103752 A1 | 6/2017 |

OTHER PUBLICATIONS

"Patents Act 1977: Examination Report under Section18(3)", Intellectual Property Office, Your Reference PCT/IB2016/057484, Application No. GB1809710.5, dated Jun. 25, 2019, 3 pages.

Larrieu et al., "Vertical nanowire array-based field effect transistors for ultimate scaling", Nanoscale, Feb. 5, 2013, ResearchGate, pp. 2437-2441.

Patent Cooperation Treaty, PCT, Notification of Transmittal of the International Search Report and the Written Opinion of the International Searching Authority, or the Declaration, Applicant's File Reference BUR150098, International application No. PCT/IB2016/057484, International Filing date: Dec. 9, 2016, 11 pages.

* cited by examiner

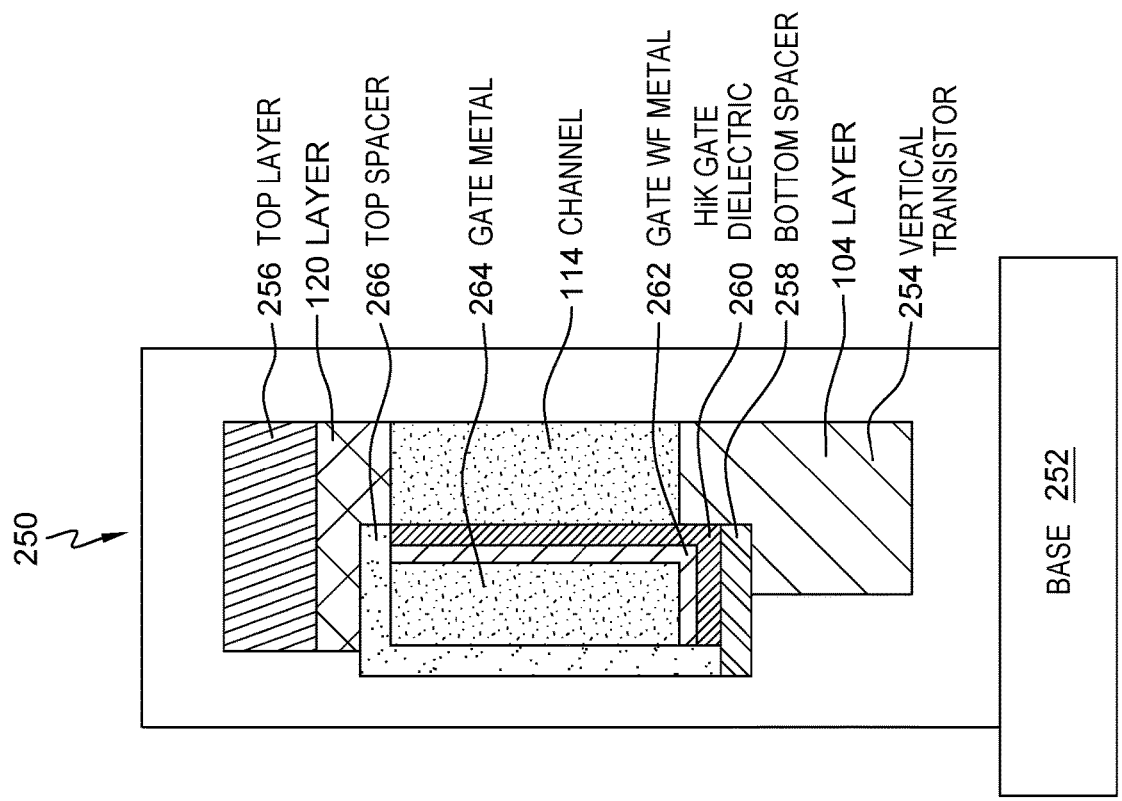
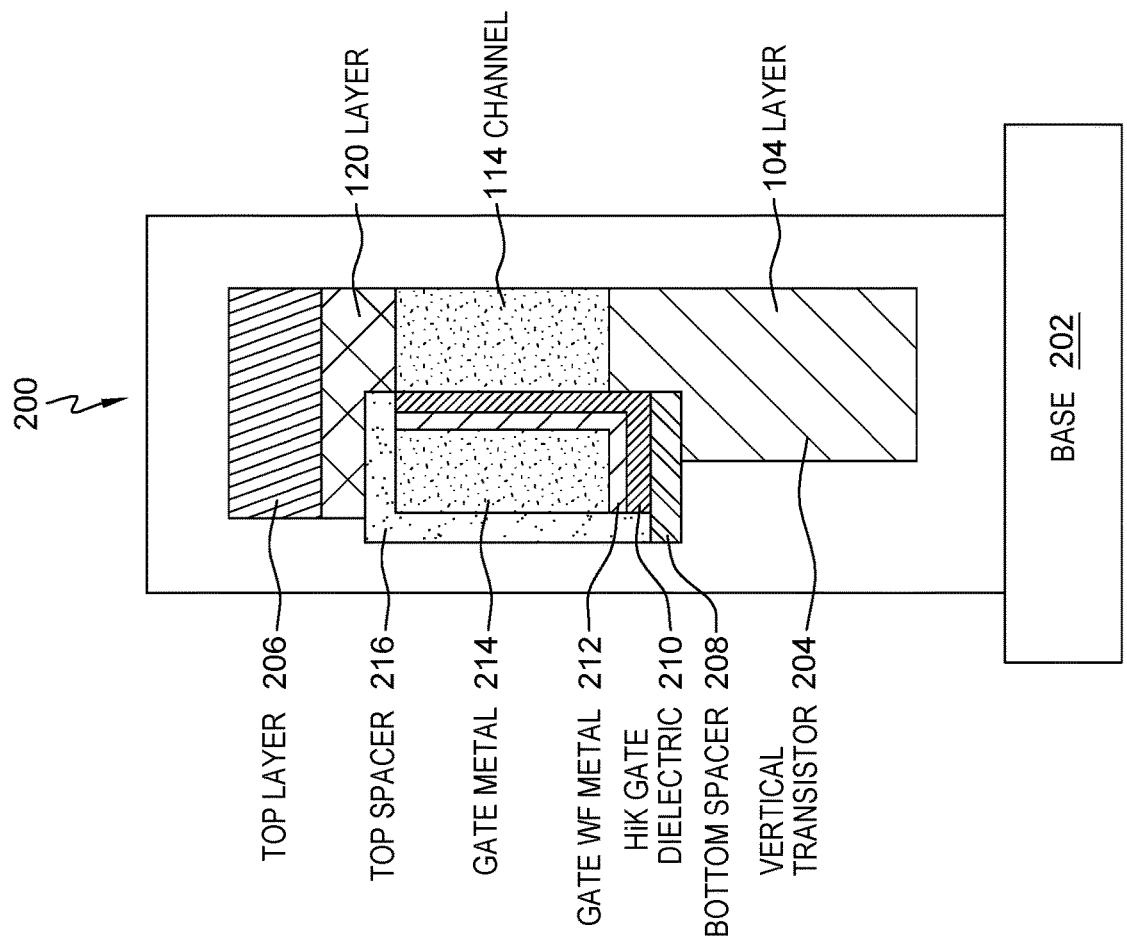

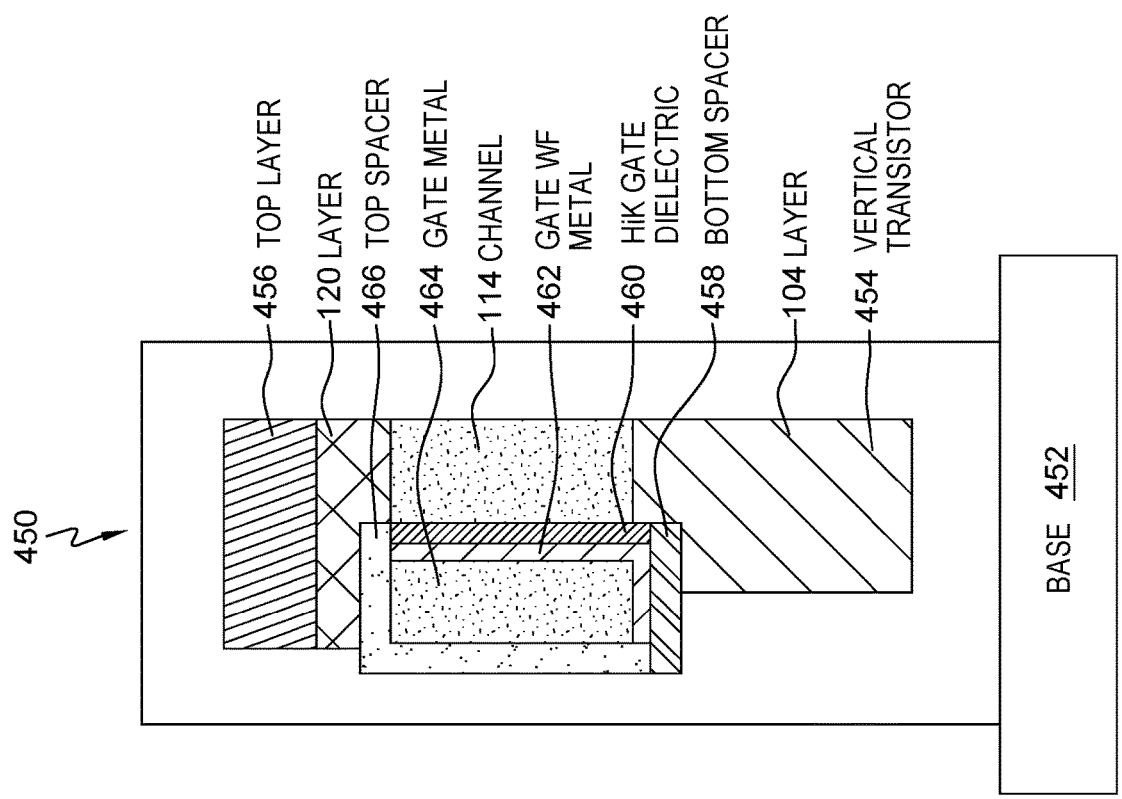
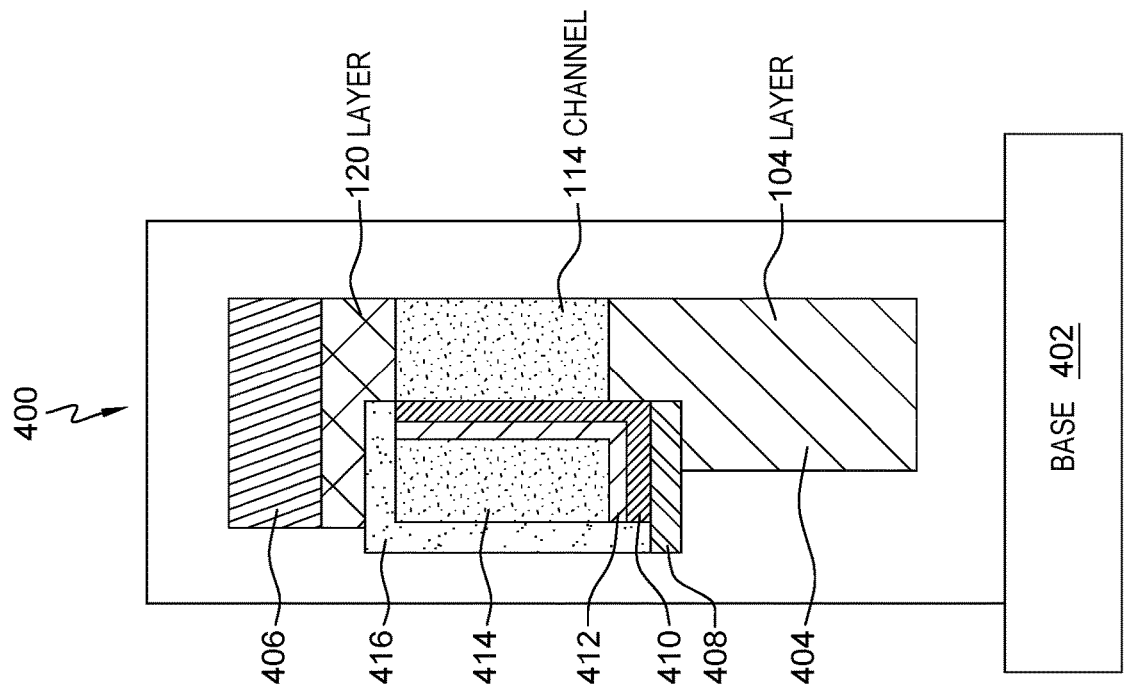
FIG. 4B
FIG. 4A

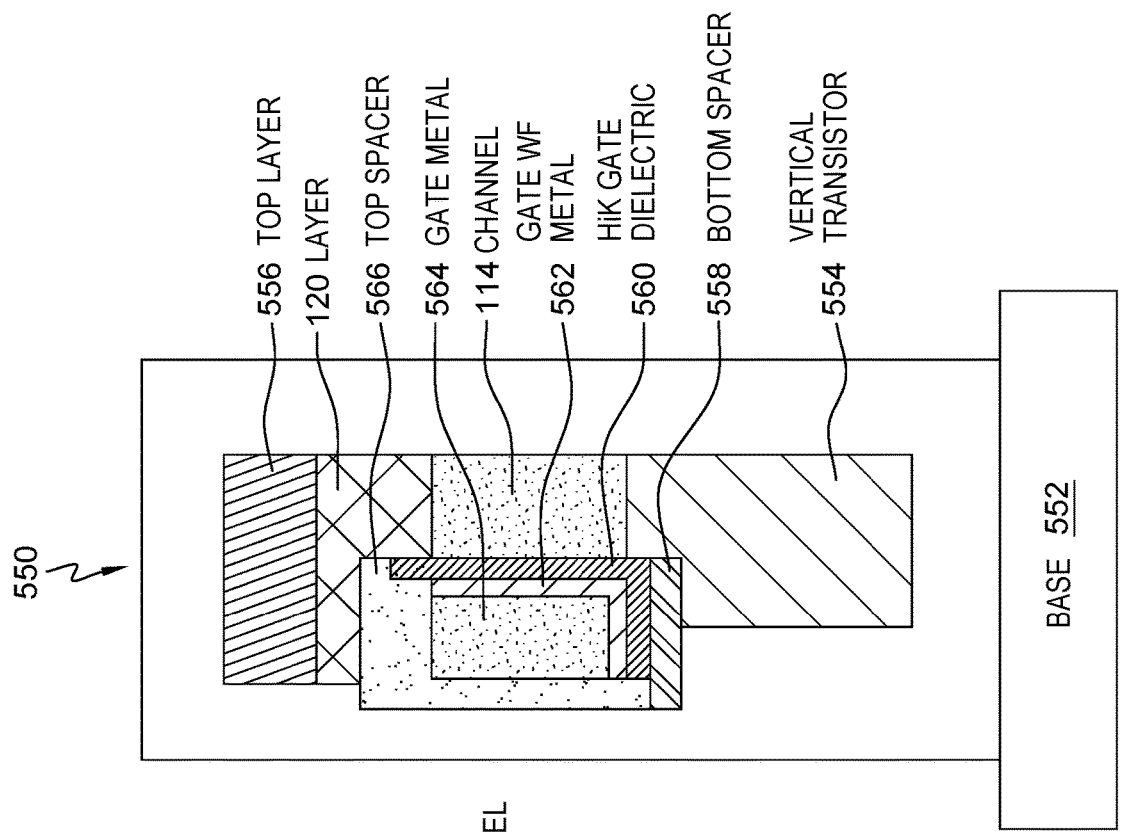
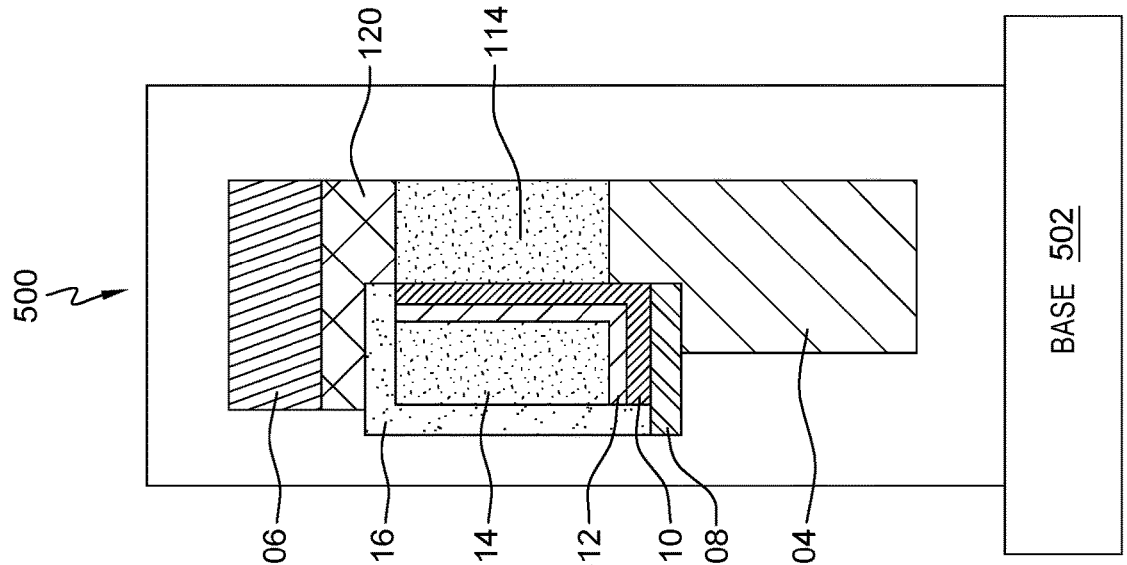
FIG. 5A
FIG. 5B

VARIABLE GATE LENGTHS FOR VERTICAL TRANSISTORS

BACKGROUND

The present invention relates generally to the field of semiconductor devices, and more particularly to the formation of modified gate lengths.

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Field-effect transistors (FETs), such as metal-oxide-semiconductor FETs (MOSFETs), are a commonly used semiconductor device. Generally, a FET has three terminals, i.e., a gate structure (or gate stack), a source region, and a drain region. In some instances, the body of the semiconductor may be considered a fourth terminal. The gate stack is a structure used to control output current, i.e., flow of carriers in the channel portion of a FET, through electrical or magnetic fields. The channel portion of the substrate is the region between the source region and the drain region of a semiconductor device that becomes conductive when the semiconductor device is turned on. The source region is a doped region in the semiconductor device from which majority carriers are flowing into the channel portion. The drain region is a doped region in the semiconductor device located at the end of the channel portion, in which carriers are flowing into from the source region via the channel portion and out of the semiconductor device through the drain region. A conductive plug, or contact, is electrically coupled to each terminal. One contact is made to the source region, one contact is made to the drain region, and one contact is made to the gate stack.

A multigate device or multiple gate field-effect transistor (MuGFET) refers to a MOSFET (metal-oxide-semiconductor field-effect transistor) which incorporates more than one gate into a single device. The multiple gates may be controlled by a single gate electrode, wherein the multiple gate surfaces act electrically as a single gate, or by independent gate electrodes. A multigate device employing independent gate electrodes is sometimes called a Multiple Independent Gate Field Effect Transistor (MIGFET).

SUMMARY

One aspect of the present invention discloses a method for fabrication of a field-effect transistor (FET) structure. The method includes prior to depositing a gate on a first vertical FET on a semiconductor substrate, depositing a first layer on the first vertical FET on the semiconductor substrate. The method further includes prior to depositing a gate on a second vertical FET on the semiconductor substrate, depositing a second layer on the second vertical FET on the semiconductor substrate. The method further includes etching the first layer on the first vertical FET to a lower height than the second layer on the second vertical FET. The method further includes depositing a gate material on both the first vertical FET and the second vertical FET. The method further includes etching the gate material on both the first vertical FET and the second vertical FET to a co-planar height.

Another aspect of the present invention discloses a method for fabrication of a field-effect transistor (FET) structure. The method includes depositing a first layer of gate materials on a first vertical FET on a semiconductor substrate. The method further includes depositing a second layer of gate materials on a second vertical FET on the semiconductor substrate. The method further includes wherein the bottom of the first layer and the bottom of the second layer are co-planar. The method further includes etching the first layer of gate materials on the first vertical FET. The method further includes etching the second layer of gate materials on the second vertical FET. The method further includes wherein the top of the first layer of gate materials and the top of the second layer of gate materials are not co-planar.

Another aspect of the present invention discloses a field-effect transistor (FET) structure. The FET structure comprises a first vertical field effect transistor (FET) formed on a semiconductor substrate and a second vertical FET formed on the semiconductor substrate. The structure further comprises the first vertical FET with a gate height co-planar to a gate height of the second vertical FET. The structure further comprises the first vertical FET comprising a first layer below a gate on the first vertical FET. The structure further comprises the second vertical FET comprising second layer below a gate on the second vertical FET. The structure further comprises wherein the first layer below the gate on the first vertical FET and the second layer below the gate on the second vertical FET are comprised of a first semiconductor material. The structure further comprises wherein the layer below the gate on the second vertical FET is not co-planar with the layer below the gate on the first vertical FET. The structure further comprises wherein the bottom of the gate on the first vertical FET is not co-planar with the bottom of the gate on the second vertical FET.

Another aspect of the present invention discloses a field-effect transistor (FET) structure. The FET structure comprises a first vertical field effect transistor (FET) formed on a semiconductor substrate and a second vertical FET formed on the semiconductor substrate. The structure further comprises the first vertical FET with a gate height that is not co-planar to a gate height of the second vertical FET. The method further comprises the first vertical FET comprising a first layer above a gate on the first vertical FET. The method further comprises the second vertical FET comprising a second layer above a gate on the second vertical FET. The method further comprises wherein the bottom of the gate on the first vertical FET is co-planar with the bottom of the gate on the second vertical FET.

BRIEF DESCRIPTION OF THE DRAWINGS

The following detailed description, given by way of example and not intended to limit the disclosure solely thereto, will best be appreciated in conjunction with the accompanying drawings, in which:

FIG. 2A depicts a cross section view of one quarter of a vertical transistor, in accordance with an embodiment of the present invention. FIG. 2B depicts a cross section view of one quarter of a vertical transistor in which the bottom S/D has been etched for a longer period, in accordance with embodiments of the present invention.

FIG. 4A depicts a cross section view of one quarter of a vertical transistor, in accordance with an embodiment of the present invention. FIG. 4B depicts a cross section view of one quarter of a vertical transistor in which the HiK foot and/or WF metal has been etched for a longer period, in accordance with embodiments of the present invention.

FIG. 5A depicts a cross section view of one quarter of a vertical transistor, in accordance with an embodiment of the present invention. FIG. 5B depicts a cross section view of one quarter of a vertical transistor in which the gate top and/or WF metal has been etched for a longer period, in accordance with embodiments of the present invention.

DETAILED DESCRIPTION

Figure 1:
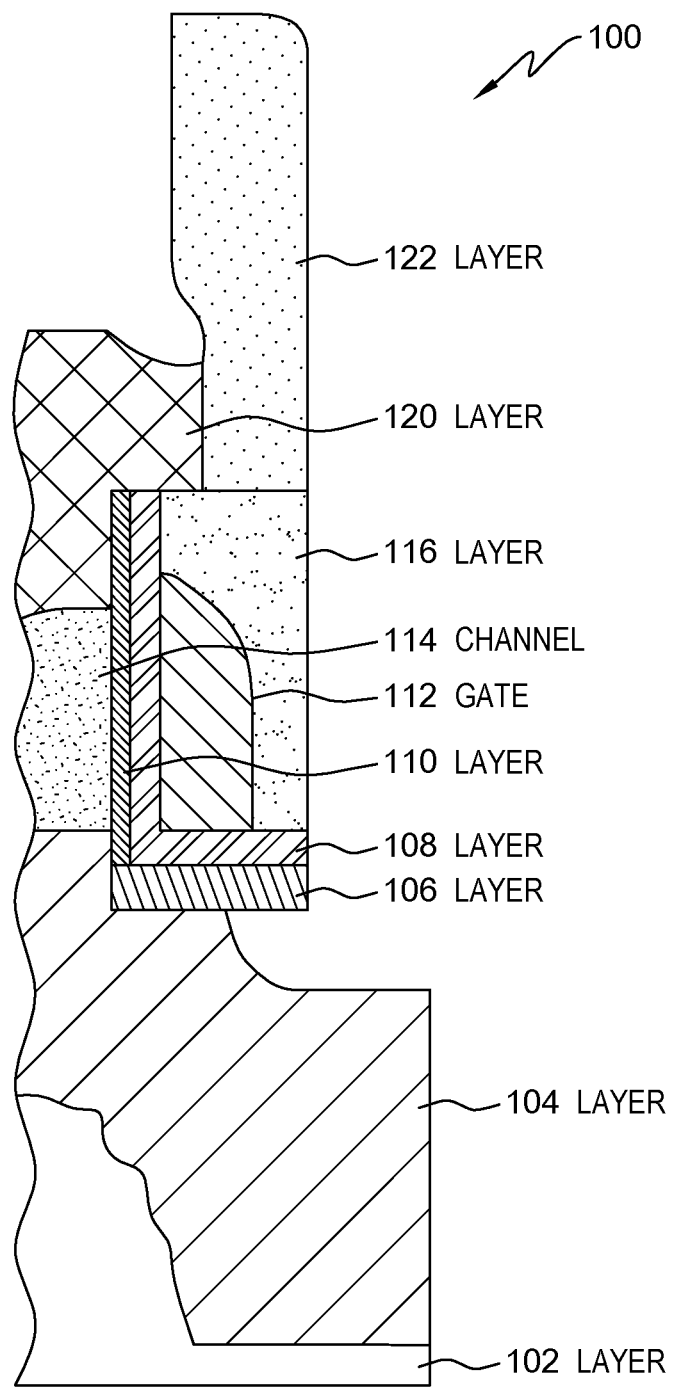
FIG. 1 depicts a cross section view of a vertical transistor, in accordance with embodiments of the invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative and not restrictive. Further, the Figures are not necessarily to scale, some features may be exaggerated to show details of particular components. Therefore, specific structural and functional details disclosed herein are not to be interpreted as limiting but merely as a representative basis for teaching one skilled in the art to variously employ the methods and structures of the present disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating, or semiconductor layers at the interface of the two elements.

Embodiments of the present invention recognize that multiple gate lengths is a popular feature to allow different Ion (on-state current) vs. Ioff (off-state current) device points. Embodiments of the present invention recognize that supporting multiple gate lengths is extremely difficult at the 7 nm node and beyond with lateral transistors due to poor Ioff with shorter gates and longer gates resulting in increased contacts resistance. Embodiments of the present invention recognize that moving to a vertical transistor allows for room to support multiple gate lengths.

Implementation of embodiments of the invention may take a variety of forms, and exemplary implementation details are discussed subsequently with reference to the Figures.

FIG. 1 depicts a cross section view of an embodiment of vertical transistor 100, in accordance with the present invention. Vertical transistor 100 may include more or less layers than depicted and is shown to represent a generic vertical transistor as known in the art. In some embodiments, vertical transistor 100 may include a single gate design, a multiple gate design, or a wraparound gate design. Layer 102 represents the base of the structure. In some embodiments, layer 102 may be a silicon wafer or any other base structure known in the art. Layer 104 represents the bottom source or drain of vertical transistor 100. In some embodiments, a designer of vertical transistor 100 may require a source or a drain at the bottom of vertical transistor 100 depending on the desired direction of flow across the channel (e.g., channel 114). In an embodiment, layer 104 may be a heavily doped source or drain. Layer 120 may be composed of a first semiconductor layer material with the same doping polarity as the device polarity. In some examples, the source/drain layer, (e.g. layer 120) may comprise a number of base semiconductor material as well as dopants. For example, layer 120 may comprise silicon, tellurium, selenium, or other n-type doping materials. In another example, layer 120 may comprise p-type doping materials. In yet another example, layer 120 may be doped using conventional methods, such as ion implantation or any other method known by a person skilled in the art.

Layer 106 may be a bottom spacer utilized to insulate the gate from the bottom source or drain to prevent shorting. In an example, a spacer may be a dielectric material, such as SiN (Silicon Nitride), a nitride compound dielectric material, or an oxide, such as $SiO_2$. In some embodiments, layer 106 may be etched smaller or not deposited, which may allow for an increase in the gate length (e.g., gate 112). In some embodiments, layer 108 may be a HiK (high K) dielectric (e.g., high K dielectric may be deposited chemical vapor deposition (CVD), atomic layer deposition (ALD), physical vapor deposition (PVD), or other similar deposition methods). Some examples of HiK materials may include $HfO_2$, $ZrO_2$, $AL_2O_3$, $TiO_2$, $LaAlO_3$, $HfSiO_2$, $Y_2O_3$, etc. In some embodiments, layer 108 may be etched to reduce or remove the bottom portion of layer 108. In some embodiments, vertical transistor 100 may include an additional gate dielectric between layer 108 and channel 114, such as layer 110. In an example, layer 110 may include a dielectric material, such as SiN (Silicon Nitride), a nitride compound dielectric material, or an oxide, such as $SiO_2$.

In some embodiments, gate 112 may include a work function metal and a low resistance metal. In an example, the work function metal may comprise the inner surface of gate 112 where gate 112 contacts the HiK layer of 108. In some embodiments, gate 112 may be etched to reach a desired gate height. Some examples of materials utilized in gate 112 may include TiN, W, Ta, TaN, Au, etc. An example of a work function metal utilized in gate 112 may include TiN, TiC, TiAlC, etc.

In some embodiments, channel 114 is a highly conductive region between the source and the drain (e.g., layer 104 and layer 120) of vertical transistor 100. In some embodiments, channel 114 may be a low bandgap channel utilizing materials, such as SiGe, GaAs, InAs, or an alloy of InGaAs, or another group IV semiconductor commonly used in the art.

In various embodiments, layer 116 is a top spacer similar to layer 106. In an example, layer 116 may include a dielectric material, such as SiN (Silicon Nitride), a nitride compound dielectric material, or an oxide, such as SiO2. In some embodiments, layer 120 is a top source or drain, such as a heavily doped source or drain. Layer 120 may be composed of a first semiconductor layer material with the same doping polarity as the device polarity. For example, layer 120 may comprise silicon, tellurium, selenium, or other n-type doping materials. In another example, layer 120 may comprise p-type doping materials. In yet another example, layer 120 may be doped using conventional methods, such as ion implantation or any other method known by a person skilled in the art. In an example, layer 104 is a source; and therefore, layer 120 is a drain. In another example, layer 104 is a drain; and therefore, layer 120 is a source. In various embodiments, layer 122 is a dielectric material, such as SiN or $SiO_2$, that enables the source to be contained above the gate (e.g., gate 112) and channel (e.g., channel 114) in vertical transistor 100.

FIGS. 2A and 2B represent devices 200 and 250 located on the same wafer. FIG. 2A depicts a cross section view of one quarter of a vertical transistor, in accordance with an embodiment of the present invention. FIG. 2B depicts a cross section view of one quarter of a vertical transistor in which the bottom S/D has been etched for a longer period, in accordance with embodiments of the present invention. In some embodiments, etching may be performed by utilizing reactive ion etching (RIE) or other methods known by a person skilled in the art.

FIG. 2A is representative of a cross section of a vertical transistor. In some embodiments, FIG. 2A may be a generic representation of vertical transistor 100. FIG. 2A includes a base 202, which is the semiconductor substrate (e.g., silicon) the vertical transistor is constructed on. FIG. 2A also includes a bottom source or drain located within vertical transistor 204 and a top source or drain located in top layer 206. FIG. 2A includes bottom spacer 208 which corresponds to layer 106 from FIG. 1. FIG. 2A further includes HiK gate dielectric 210 that corresponds to layer 108 in FIG. 1, gate WF (work function) metal 212 and gate metal 214 that corresponds to gate 112 in FIG. 1, and top spacer 216 that corresponds to layer 116 in FIG. 1.

FIG. 2B depicts a cross section view representing the difference between a standard vertical transistor (e.g., 200 from FIG. 2A) and a modified vertical transistor (e.g., 250 from FIG. 2B) to adjust the gate length. In FIG. 2B, the bottom source or drain represented at the bottom portion of vertical transistor 254, and also corresponding to layer 104 in FIG. 1, can be etched to different lengths. In an example, device 200 of FIG. 2A is masked and device 250 of FIG. 2B is selectively etched. By masking the device 200 of FIG. 2A prior to the selective etching, device 200 remains unchanged while device 250 is etched. By etching the bottom source or drain (e.g., the lower portion of vertical transistor 254) the gate length can be extended while keeping the same overall height for FIG. 2B as in FIG. 2A (e.g., the tops of gate metals 214 and 264 are co-planar). In an embodiment, the bottom source or drain of device 250 is selectively etched. After a spacer and HiK gate dielectric are added, gate materials are then added to both devices 200 and 250, which are subsequently etched to the same gate height resulting in a longer gate for device 250.

In an example, the bottom source or drain of vertical transistor 254 has been etched lower relative to the bottom source or drain of vertical transistor 204. Bottom spacer 258 is added via process that grows, coats, or otherwise transfers a material onto the wafer, such as PVD, CVD, etc., in the same amount as bottom spacer 208 in FIG. 2A. HiK gate dielectric 260 is added similar to HiK gate dielectric 210 in FIG. 2A; however, HiK gate dielectric 260 and HiK gate dielectric 210 are etched to a co-planar level. In an example, HiK gate dielectric 210 and HiK gate dielectric 260 are added to devices 200 and 250 in an "overflow" amount, and then etched back to a desired co-planer level. Gate WF metal 262 and gate metal 264 are added in the same manner as gate WF metal 212 and gate metal 214 in FIG. 2A; however, gate WF metal 212 and gate WF metal 262 are etched to a co-planar level. In an example, gate WF metal 212 and gate WF metal 262 are added to devices 200 and 250 in an "overflow" amount and then etched back to a desired co-planer level. Top spacer 266 is added to cover the top of the gates as in top spacer 216 in FIG. 2A; however, top spacer 216 and top spacer 266 are etched to a co-planar level. In an example, top spacer 216 and top spacer 266 are added to devices 200 and 250 in an "overflow" amount and then etched back to a desired co-planer level. Top layer 256 represents the top source or drain in FIG. 2B, which is the same size as top layer 206 in FIG. 2A.

Figure 3B:
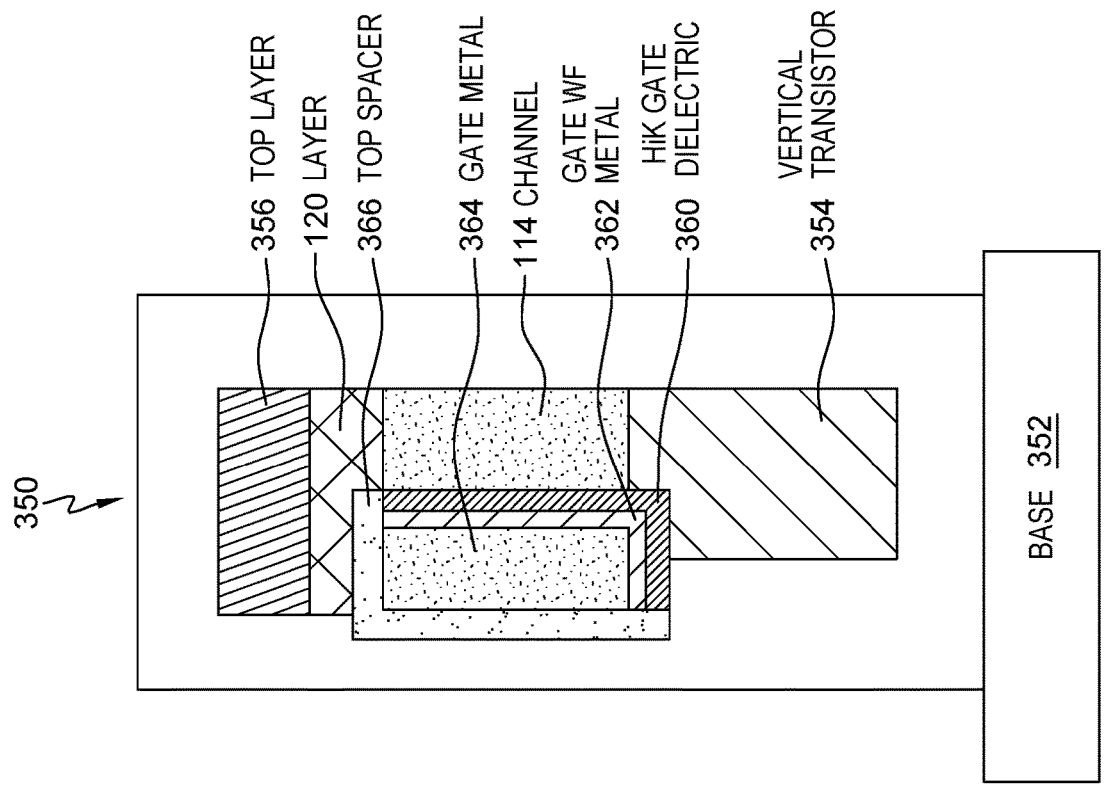
FIG. 3B depicts a cross section view of one quarter of a vertical transistor in which the bottom spacer has been etched for a longer period, in accordance with embodiments of the present invention.
Figure 3A:
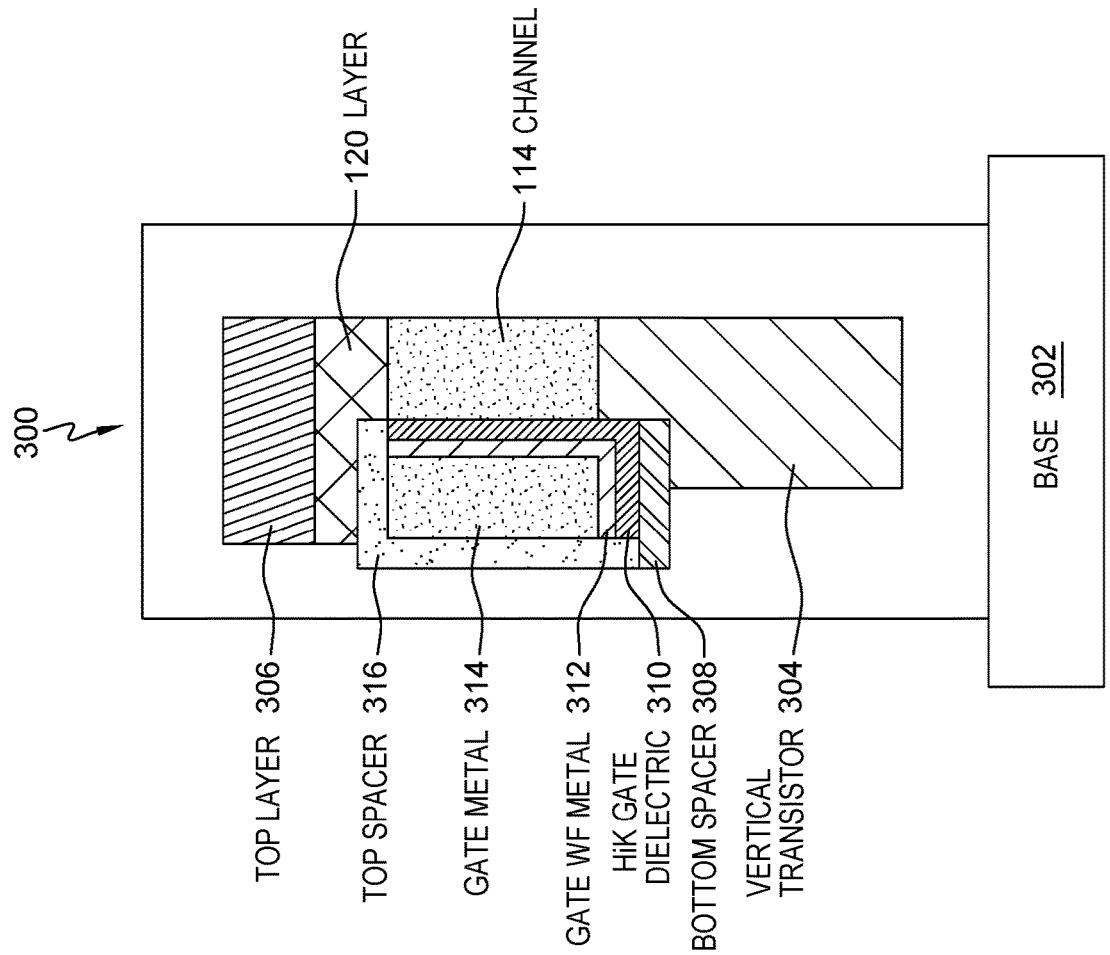
FIG. 3A depicts a cross section view of one quarter of a vertical transistor, in accordance with an embodiment of the present invention.

FIGS. 3A and 3B represent devices 300 and 350 located on the same wafer. FIG. 3 depicts a cross section view of one quarter of a vertical transistor, in accordance with an embodiment of the present invention. FIG. 3B depicts a cross section view of one quarter of a vertical transistor in which the bottom spacer has been etched for a longer period, in accordance with embodiments of the present invention. In some embodiments, etching may be performed by utilizing reactive ion etching (RIE) or other methods known by a person skilled in the art.

FIG. 3A is representative of a cross section of a vertical transistor. In some embodiments, FIG. 3A may be a generic representation of vertical transistor 100. FIG. 3A includes a base 302, which is the semiconductor substrate (e.g., silicon) the vertical transistor is constructed on. FIG. 3A also includes a bottom source or drain located within vertical transistor 304 and a top source or drain located in top layer 306. FIG. 3A includes bottom spacer 308 which corresponds to layer 106 from FIG. 1. FIG. 3A further includes HiK gate dielectric 310 that corresponds to layer 108 in FIG. 1, gate WF (work function) metal 312 and gate metal 314 that corresponds to gate 112 in FIG. 1, and top spacer 316 that corresponds to layer 116 in FIG. 1.

FIG. 3B depicts a cross section view representing the difference between a standard vertical transistor (e.g., device 300 from FIG. 3A) and a modified vertical transistor (e.g., device 350 from FIG. 3B) to adjust the gate length. In FIG. 3B, the bottom source or drain represented at the bottom portion of vertical transistor 354, and also corresponding to layer 104 in FIG. 1, which is maintained as the same size as in FIG. 3A. In an embodiment, by etching the bottom spacer (e.g., bottom spacer not shown because it has been etched to completely remove the spacer in FIG. 3B or layer 106 in FIG. 1) the gate length can be extended while keeping the same overall height for FIG. 3B as in FIG. 3A. In an embodiment, the bottom spacer of device 350 from FIG. 3B is etched more. In an example, the bottom spacer (e.g., bottom spacer 358) of device 300 of FIG. 3A is masked and device 350 of FIG. 3B is selectively etched. By masking device 300 of FIG. 3A prior to the selective etching, device 300 remains unchanged while device 350 is etched. By etching the bottom spacer (e.g., bottom spacer 358) the gate length can be extended while keeping the same overall height for FIG. 3B as in FIG. 3A (e.g., the tops of gate metals 314 and 364 are co-planar). In an embodiment, the bottom spacer of FIG. 3B, device 350 is selectively etched. Gate materials are then added to both devices 300 and 350, which are subsequently etched to the same gate height resulting in a longer gate for device 350.

In an example, bottom spacer 358 has been etched lower relative to bottom spacer 308. In another example, bottom spacer 358 may not be added or bottom spacer 358 is etched (e.g., RIE etched) to remove bottom spacer 358 completely. HiK gate dielectric 360 is added similar to HiK gate dielectric 310 in FIG. 3A; however, HiK gate dielectric 360 and HiK gate dielectric 310 are etched to a co-planar level. In an example, HiK gate dielectric 310 and HiK gate dielectric 360 are added to devices 300 and 350 in an "overflow" amount and then etched back to a desired co-planer level. Gate WF metal 362 and gate metal 364 are added in the same manner as gate WF metal 312 and gate metal 314 in FIG. 3A; however, gate WF metal 312 and gate WF metal 362 are etched to a co-planar level. In an example, gate WF metal 312 and gate WF metal 362 are added to devices 300 and 350 in an "overflow" amount and then etched back to a desired co-planer level. Top spacer 366 is added by the same method to cover the top of the gates as in top spacer 316 in FIG. 3A; however, top spacer 316 and top spacer 366 are etched to a co-planar level. In an example, top spacer 316 and top spacer 366 are added to devices 300 and 350 in an "overflow" amount and then etched back to a desired co-planer level. Top layer 356 represents the top source or drain in FIG. 3B, which is the same size as top layer 306 in FIG. 3A.

FIGS. 4A and 4B represent devices 400 and 450 located on the same wafer. FIG. 4A depicts a cross section view of one quarter of a vertical transistor, in accordance with an embodiment of the present invention. FIG. 4B depicts a cross section view of one quarter of a vertical transistor in which the HiK gate dielectric has been etched for a longer period, in accordance with embodiments of the present invention. In some embodiments, etching may be performed by utilizing reactive ion etching (RIE) or other methods known by a person skilled in the art.

FIG. 4A is representative of a cross section of a vertical transistor. In some embodiments, FIG. 4A may be a generic representation of vertical transistor 100. FIG. 4A includes a base 402, which is the semiconductor substrate (e.g., silicon) the vertical transistor is constructed on. FIG. 4A also includes a bottom source or drain located within vertical transistor 404 and a top source or drain located in top layer 406. FIG. 4A includes bottom spacer 408 which corresponds to layer 106 from FIG. 1. FIG. 4A further includes HiK gate dielectric 410 that corresponds to layer 108 in FIG. 1, gate WF (work function) metal 412 and gate metal 414 that corresponds to gate 112 in FIG. 1, and top spacer 416 that corresponds to layer 116 in FIG. 1.

FIG. 4B depicts a cross section view representing the difference between a standard vertical transistor (e.g., device 400 from FIG. 4A) and a modified vertical transistor (e.g., device 450 from FIG. 4B) to adjust the gate length. In FIG. 4B, the bottom source or drain represented at the bottom portion of vertical transistor 454, and also corresponding to layer 104 in FIG. 1, which is maintained as the same size as in FIG. 4A. Bottom spacer 458 is added in the same amount as bottom spacer 408 in FIG. 4A. In an embodiment, by etching the HiK gate dielectric (e.g., HiK gate dielectric 460 in FIG. 4B or layer 108 in FIG. 1) the gate length can be extended while keeping the same overall height for FIG. 4B as in FIG. 4A. In an embodiment, the HiK gate dielectric of FIG. 4B is etched more. In an example, the HiK gate dielectric (e.g., HiK gate dielectric 410) of device 400 of FIG. 4A is masked and device 450 of FIG. 4B is selectively etched. By masking device 400 of FIG. 4A prior to the selective etching, device 400 remains unchanged while device 450 is etched. By etching the HiK gate dielectric (e.g., HiK gate dielectric 460) the gate length can be extended while keeping the same overall height for FIG. 4B as in FIG. 4A (e.g., the tops of gate metals 414 and 464 are co-planar). In an embodiment, the HiK gate dielectric of FIG. 4B device 450 is selectively etched. Gate materials are then added to both devices 400 and 450, which are subsequently etched to the same gate height resulting in a longer gate for device 450.

In an example, HiK gate dielectric 460 has been etched lower relative to HiK gate dielectric 410. In another example, HiK gate dielectric 460 may not be added or etched to remove bottom portion of HiK gate dielectric 460 completely. Gate WF metal 462 and gate metal 464 are added in the same manner as gate WF metal 412 and gate metal 414 in FIG. 4A; however, gate WF metal 412 and gate WF metal 462 are etched to a co-planar level. In an example, gate WF metal 412 and gate WF metal 462 are added to devices 400 and 450 in an "overflow" amount and then etched back to a desired co-planer level. Top spacer 466 is added by the same method to cover the top of the gates as in top spacer 416 in FIG. 4A; however, top spacer 416 and top spacer 466 are etched to a co-planar level. In an example, top spacer 416 and top spacer 466 are added to devices 400 and 450 in an "overflow" amount and then etched back to a desired co-planer level. Top layer 456 represents the top source or drain in FIG. 4B, which is the same size as top layer 406 in FIG. 4A.

FIGS. 5A and 5B represent devices 500 and 550 located on the same wafer. FIG. 5A depicts a cross section view of one quarter of a vertical transistor, in accordance with an embodiment of the present invention. FIG. 5B depicts a cross section view of one quarter of a vertical transistor in which the gate metal has been etched for a longer period, in accordance with embodiments of the present invention. In some embodiments, etching may be performed by utilizing reactive ion etching (RIE) or other methods known by a person skilled in the art.

FIG. 5A is representative of a cross section of a vertical transistor. In some embodiments, FIG. 5A may be a generic representation of vertical transistor 100. FIG. 5A includes a base 502, which is the semiconductor substrate (e.g., silicon) the vertical transistor is constructed on. FIG. 5A also includes a bottom source or drain located within vertical transistor 504 and a top source or drain located in top layer 506. FIG. 5A includes bottom spacer 508 which corresponds to layer 106 from FIG. 1. FIG. 5A further includes HiK gate dielectric 510 that corresponds to layer 108 in FIG. 1, gate WF (work function) metal 512 and gate metal 514 that corresponds to gate 112 in FIG. 1, and top spacer 516 that corresponds to layer 116 in FIG. 1.

FIG. 5B depicts a cross section view representing the difference between a standard vertical transistor (e.g., device 500 from FIG. 5A) and a modified vertical transistor (e.g., device 550 from FIG. 5B) to adjust the gate length. In FIG. 5B, the bottom source or drain represented at the bottom portion of vertical transistor 554, and also corresponding to layer 104 in FIG. 1, which is maintained as the same size as in FIG. 5A. Bottom spacer 558 is added in the same amount as bottom spacer 508 in FIG. 5A. HiK gate dielectric 560 is added similar to HiK gate dielectric 510 in FIG. 5A. In an embodiment, by etching the gate WF metal (e.g., gate WF metal 562 in FIG. 5 or gate 112 in FIG. 1) and/or gate metal (e.g., gate metal 564 in FIG. 5 or gate 112 in FIG. 1) the gate length can be shortened while keeping the same overall height for FIG. 5B as in FIG. 5A. In an embodiments, gate WF metal 562 and/or gate metal 564 of FIG. 5B are etched more. In an example, the gate WF metal and/or gate metal (e.g., gate WF metal 512 and/or gate metal 514) of device 500 of FIG. 5A is masked and device 550 of FIG. 5B is selectively etched. By masking device 500 of FIG. 5A prior to the selective etching, device 500 remains unchanged while device 550 is etched. By etching the gate WF metal and/or gate metal (e.g., gate WF metal 562 and/or gate metal 564) the gate length can be shortened while keeping the same overall height for FIG. 5B as in FIG. 5A (e.g., the tops of gate metals 514 and 564 are co-planar).

In an example, gate metal 564 has been etched lower relative to gate metal 514. In another example, gate WF metal 562 has been etched lower relative to gate WF metal 512. In yet another example, both gate metal 564 and gate WF metal 562 have been etched lower. Top spacer 566 is added by the same method to cover the top of the gates as in top spacer 516 in FIG. 4A; however, top spacer 516 and top spacer 566 are etched to a co-planar level. In an example, top spacer 516 and top spacer 566 are added to devices 500 and 550 in an "overflow" amount and then etched back to a desired co-planer level. Top layer 556 represents the top source or drain in FIG. 5B, which is the same size as top layer 506 in FIG. 5A.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for fabricating a vertical field-effect transistor (FET) structure, the method comprising:
    prior to depositing a gate of a first vertical FET on a semiconductor substrate, depositing a first layer of the first vertical FET on the semiconductor substrate;
    prior to depositing a gate of a second vertical FET on the semiconductor substrate, depositing a second layer of the second vertical FET on the semiconductor substrate;
    etching the first layer of the first vertical FET to a lower height than the second layer of the second vertical FET;
    depositing a gate material of both the first vertical FET and the second vertical FET; and
    etching the gate material of both the first vertical FET and the second vertical FET to a co-planar height, wherein the first layer and the second layer comprises a spacer.

2. The method of claim 1, wherein etching the first layer on the first vertical FET comprises etching the first layer to remove the first layer.

3. The method of claim 1, wherein etching the first layer on the first vertical FET comprises etching the first layer to remove a portion of spacer layer respective the second layer.

4. The method of claim 1, wherein the first layer and the second layer comprises a high K gate dielectric.

5. The method of claim 4, wherein the first layer and the second layer comprise a vertical part and a horizontal part.

6. The method of claim 5, wherein etching the first layer on the first vertical FET comprises etching the first layer to remove the horizontal part of the first layer.

7. The method of claim 5, wherein etching the layer on the first vertical FET comprises etching the layer to remove a portion of the horizontal part of the first layer.

* * * * *